United States Patent [19]

Hirao

[11] Patent Number: 4,665,424
[45] Date of Patent: May 12, 1987

[54] SEMICONDUCTOR DEVICE

[75] Inventor: Tadashi Hirao, Itami, Japan

[73] Assignee: Mitsubishi Denki Kabushiki Kaisha, Tokyo, Japan

[21] Appl. No.: 698,523

[22] Filed: Feb. 5, 1985

[30] Foreign Application Priority Data

Mar. 30, 1984 [JP] Japan .................................. 59-64577
Jun. 14, 1984 [JP] Japan .................................. 59-124146
Aug. 30, 1984 [JP] Japan .................................. 59-183005

[51] Int. Cl.$^4$ ............................................. H01L 29/72
[52] U.S. Cl. ........................................ 357/34; 357/59; 357/67; 357/71
[58] Field of Search ..................... 357/71 S, 71 P, 34, 357/36, 35, 65, 67, 67 S, 71, 59 H

[56] References Cited

U.S. PATENT DOCUMENTS

| | | | |
|---|---|---|---|
| 3,704,398 | 11/1972 | Fukino | 357/36 |
| 3,762,966 | 10/1973 | Engeler et al. | 357/36 X |
| 4,252,840 | 2/1981 | Minami | 357/71 P X |
| 4,329,706 | 5/1982 | Crowder et al. | 357/71 P |
| 4,476,482 | 10/1984 | Scott et al. | 357/71 S |

OTHER PUBLICATIONS

Berndlmaier, E., Blumberg, R., Brenner, S., Dorler, J. A., "High-Performance Transistor", IBM Tech. Discl. Bull., vol. 19, No. 6, Nov. 1976.

Article: "Subnanosecond Self-Aligned I$^2$L/MTL Circuits", D. D. Tang et al, IEEE Transactions on Electron Devices, vol. ED-27, No. 8, Aug. 1980, pp. 1379-1384.

Primary Examiner—Martin H. Edlow
Assistant Examiner—Sara W. Crane
Attorney, Agent, or Firm—Lowe Price LeBlanc Becker & Shur

[57] ABSTRACT

Disclosed herein is a semiconductor device applicable to a bipolar semiconductor integrated circuit device in which a base electrode (9) is directly extracted from an active base region (61) through a superposed layer of a polysilicon film (601) and a metal silicide film (501) while an emitter electrode (10) is partially formed by a polysilicon film (602) and a contact hole is defined to form a base metal silicide film with the polysilicon film being employed as a mask. Consequently, the distance between an emitter layer (71) and a base electrode hole (50) is reduced without necessity of including margins of emitter and base electrode wires extending over respective holes in the said distance.

10 Claims, 23 Drawing Figures

SEMICONDUCTOR DEVICE

BACKGROUND OF THE INVENTION

1. Field of the Invention

The present invention relates to a semiconductor device and a method of manufacturing the same. More specifically, it relates to an improvement in a transistor extracting portion in a bipolar semiconductor integrated circuit device.

2. Description of the Prior Art

In general, a transistor of a bipolar semiconductor integrated circuit device is formed in an electrically isolated island by p-n junction/isolation, oxide film isolation employing a selective oxidization process or a method employing triple diffusion. Such a semiconductor device is well known in the art by U.S. Pat. No. 4,445,268 entitled "Method of Manufacturing a Semiconductor Integrated Circuit BI-MOS Device" granted to Hirao. Further, technique of forming an oxide film only in a region around a polysilicon portion of a polysilicon emitter is disclosed in "Subnanosecond Self-Aligned I²L/MTL Circuits", IEEE Transactions on Electron Device Vol. ED-27 No. 8, August 1980, pp. 1379.

FIGS. 1A to 1E are cross-sectional views showing principal steps of a conventional method of manufacturing a semiconductor device. The conventional method of manufacturing a semiconductor device is now described with reference to these drawings. An n+-type layer 2 of high impurity concentration for implementing a collector buried layer is selectively formed on a p−-type silicon substrate 1 of low impurity concentration, followed by growth of an n−-type epitaxial layer 3 thereon (FIG. 1A).

Then the substance is selectively oxidized by utilizing a nitride film 201 formed on a pad oxide film 101 as a mask, whereby a thick isolation oxide film 102 is formed while a p-type layer 4 is simultaneously formed under the isolation oxide film 102 for cutting a channel (FIG. 1B).

The nitride film 201 employed as a mask for the aforementioned selective oxidization is then removed with the pad oxide film 101 to newly form an oxide film 103 for protecting the substance from ion implantation, thereby to form a p+-type layer 5 for implementing an external base layer by employing a photoresist film (not shown in this stage) as a mask. Thereafter the photoresist film is removed to newly form a photoresist film 301, which is employed as a mask for forming a p-type layer 6 for implementing an active base layer by ion implantation (FIG. 1C).

The photoresist film 301 is then removed and the substance is covered by a passivation film 401 generally made of phos-silicate glass (PSG) and subjected to heat treatment for annealing the base ion implantation layers 5 and 6 as well as densificating the PSG film 401 to form an external base layer 51 and an active base film 61 in an intermediate stage, followed by formation of holes 70 and 80 in the PSG film 401 to form an n−-type layer 7 for implementing an emitter layer and an n+-type layer 8 for implementing a collector electrode extracting layer by ion implantation (FIG. 1D).

Thereafter the respective ion implantation layers are annealed to completely implement an external base layer 52 and an active base layer 62 and form an emitter layer 71 and a collector electrode extracting layer 81, followed by formation of a hole 50 for extracting the base electrode. Then the respective holes 50, 70 and 80 are provided with films 501 of metal silicide such as platinum silicide (Pt-Si) and palladium silicide (Pd-Si) for preventing junction-spike of the electrodes, followed by formation of a base electrode wire 9, an emitter electrode wire 10 and a collector electrode wire 11 by low-resistance metal such as aluminum (Al) (FIG. 1E).

FIGS. 2, 3A and 3B are plan views showing patterns of conventional transistors manufactured by the above conventional method. FIG. 2 shows single-base structure which corresponds to FIG. 1E and FIG. 3A shows double-base structure while FIG. 3B shows multi-emitter structure.

Generally, the frequency characteristic of a transistor depends on the base-to-collector capacitance and the base resistance etc., which must be decreased for improving the frequency characteristic. The p+-type external base layer 52 is provided for lowering the base resistance in the aforementioned structure, whereas provision of the same leads to increase in the base-to-collector capacity. Further, the base resistance depends on a distance $D_1$ between the emitter layer 71 and the base electrode extracting hole 50, i.e., the total of the distance between the base electrode wire 9 and the emitter electrode wire 10 and the length of margins of the respective electrode wires 9 and 10 extending over the respective holes 50 and 70, and such margins inevitably remain even if the distance between the electrode wires 9 and 10 is reduced by improving accuracy of photoetching. Further, the transistor may be brought in the double-base structure as shown in FIG. 3A for reducing the base resistance, as is well known in the art. In this case, the emitter length $L_2$ as shown in FIG. 3A may be slightly smaller than the emitter length $L_1$ as shown in FIG. 2 since only the edge portion of the emitter opposite to the base electrode may be moved in high-current/high-frequency operation. However, the base area is extremely increased in the double-base structure. Further, the base wiring region is also increased.

As well known in the art, further, the transistor may be brought in the multi-emitter structure as shown in FIG. 3B for reducing the base resistance while improving the current driving ability. In this case, the emitter length $L_3$ as shown in FIG. 3B may be slightly smaller than the emitter length $L_1$ as shown in FIG. 2, since only the edge portions of the emitters opposite to the base electrode may be moved in high-current/high-frequency operation. However, the base area is extremely increased in the multi-emitter structure since provision of a base electrode is required between the emitters. Further, the base wiring region is also increased.

SUMMARY OF THE INVENTION

Accordingly, a principal object of the present invention is to provide a semiconductor device which can reduce the distance between an emitter layer and a base electrode hole with no necessity of including margins of electrode wires extending over respective holes in the said distance and prevent increase in the base-to-collector capacity without employing an external base layer of high impurity concentration.

The semiconductor device according to the present invention is manufactured as follows: A base region of a second conductive type is formed on a predetermined region of the major surface of a semiconductor layer of a first conductive type which is enclosed by an isolation oxide film while an insulating film having a hole continuous with the semiconductor layer and the base region and communicating with the base region is formed on the semiconductor layer in the inner side of the isolation oxide film to be separated from the same. A collector region is formed on the major surface of the semiconductor layer between the insulating film and the isolation oxide film to be separated from an emitter region of the second conductive type formed on the major surface of the base region under the hole of the insulating film and the base region while a first silicon film is formed in the hole of the insulating film. On the base region between the insulating film and the isolation oxide film, a second silicon film is formed to extend from the insulating film to the base region, and a metal silicide film is formed on the second silicon film and the base region between the second silicon film and the insulating film. Then a base electrode is formed on the isolation oxide film and an emitter electrode is formed on the first silicon film while a collector electrode is formed in the collector region to be in contact with the metal silicide film.

Thus, according to the present invention, the base electrode is formed in double-layer structure of the second silicon film and the metal silicide film on the isolation oxide film which is adjacent to an extraction base layer and the emitter electrode is partially formed by the silicon film while a base contact portion is defined for forming the base metal silicide film with the said silicon film being employed as a mask, whereby the distance between the base electrode extracting region and the emitter layer can be reduced to decrease the base resistance. Further, the base-to-collector capacity can be reduced without providing an external base layer of high impurity concentration, whereby a semiconductor device having an excellent frequency characteristic is obtained.

In a preferred embodiment of the present invention, two holes are defined in an insulating film to communicate with a base region so that a second silicon film is formed on the two holes and a metal silicide film is formed on the second silicon film thereby to bring the semiconductor device in double-base structure. Consequently, the base area is reduced to prevent increase in the base-to-collector capacity of the semiconductor device.

In another preferred embodiment of the present invention, at least two emitter regions of a second conductive type are formed on the major surface of a base region to connect the said at least two emitter regions by a first silicon film and a metal silicide film is formed on the base region to cover three sides each of the said at least two emitter regions thereby to bring the semiconductor device in multi-emitter structure.

Thus, according to this embodiment, three sides each of the said at least two emitter regions are connected to the base electrode through the metal silicide film without providing a specific base electrode between the emitter regions, whereby the base area can be extremely reduced. Further, no external base layer of high impurity concentration is provided and hence the base-to-collector capacity can be reduced to obtain a semiconductor device which has an excellent frequency characteristic.

In a method of manufacturing a semiconductor device according to the present invention, a semiconductor layer of a first conductive type is formed to be enclosed by an isolation oxide film in a first step. Then a base region of a second conductive type is formed in a part of the surface of the first conductive type semiconductor layer in a second step and a first silicon film is formed over a part of the base region and the isolation region which is in contact with the base region in a third step, while a silicon oxide film is formed on the surface of the semiconductor layer including the base region and the insulating film in a fourth step. The silicon oxide film is selectively etched to remove the silicon oxide film from a portion for forming a collector electrode extracting layer and a portion for forming an emitter layer in a fifth step and a second silicon film is formed to be selectively removed with the portions covering the emitter layer and the collector electrode extracting layer being employed as masks in a sixth step. Selectively removed in a seventh step are oxide films on the base layer and the second silicon film including a part of the second silicon film, and in an eighth step, a thick oxide film is formed on the second silicon film at least in a portion located on the emitter layer to which highly concentrated impurities of the first conductive type are introduced while a thin oxide film is formed on a base electrode forming portion exposed in the seventh step respectively at a relatively low temperature. Then a metal silicide film is formed on the insulating film on the base electrode extracting region and the base layer in a ninth step, and then in a tenth step, a protection film is formed on the isolation region and regions enclosed by the isolation region and passed through the respective steps, so that a base electrode is formed on the first silicon film and an emitter electrode is formed on the emitter layer while a collector electrode is formed on the collector electrode extracting layer respectively through holes defined in the protection film.

The above and other objects, features, aspects and advantages of the present invention will become apparent from the following detailed description of the present invention when taken in conjunction with the accompanying drawings.

DESCRIPTION OF THE PREFERRED EMBODIMENTS

Figure 4A:
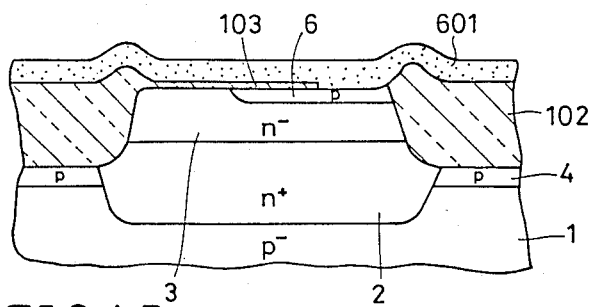
FIGS. 4A to 4G are cross-sectional views showing principal steps of a method of manufacturing a semiconductor device according to an embodiment of the present invention.

FIGS. 4A to 4G are cross-sectional views showing steps of a method of manufacturing a semiconductor device according to an embodiment of the present invention, and components similar to those in FIGS. 1A to 1E are indicated by the same reference numerals. Similarly performed in this method are the steps shown in FIGS. 1A and 1B, such that an $n^+$-type collector buried layer 2, an $n^-$-type epitaxial layer 3, a channel-cutting p-type layer 4 and an isolation oxide film 102 are formed on a $p^-$-type silicon substrate 1. Removed then are a nitride film and a base oxide film similar to those indicated by numerals 201 and 101 in FIG. 1B to newly form an oxide film 103 for protecting the substance from ion implantation, followed by formation of a p-type layer 6 for implementing an active base layer through a photoresist mask (not shown) by ion implantation. Thereafter the oxide film 103 in the vicinity of a region for defining a base electrode hole is removed and a polysilicon film 601 which serves as a first silicon film is coated over the entire upper surface of the substance including the said region from which the oxide film 103 is removed (FIG. 4A).

Figure 4B:
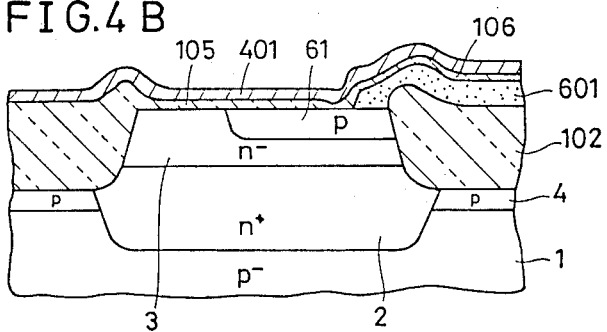

Then p-type impurities are introduced to the whole surface of the polysilicon film 601 and the substance is sintered to form an active base region 61 in an intermediate stage from by the p-type layer 6, and the polysilicon film 601 is removed by selective etching and the substance is oxidized anew to form an oxide film 105 at a position from which the oxide film 103 is removed and an oxide film 106 on the remaining polysilicon film 601, followed by formation of a PSG film 401 which serves as an insulating film over the entire upper surface (FIG. 4B).

Figure 4C:
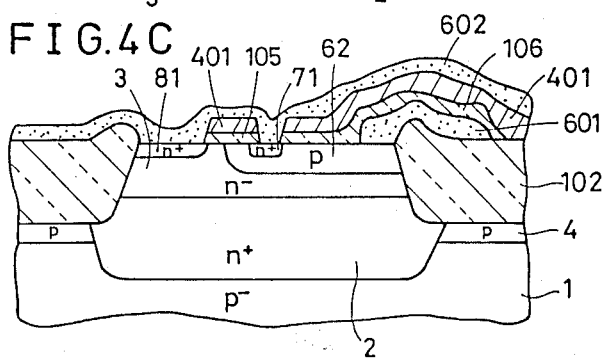

Then the oxide film 105 and the PSG film 401 are removed by selective etching employing photoresist masks (not shown) from regions for defining an emitter layer and a collector electrode extracting layer to cover the regions by a polysilicon film 602 which serves as a second silicon film, and highly concentrated n-type impurities are introduced by ion implantation to the polysilicon film 602. Thereafter the substance is driven to form, by diffusion from the polysilicon film 602, an $n^+$-type layer 71 for implementing an emitter layer and an $n^+$-type layer 81 for implementing a collector electrode extracting layer (FIG. 4C).

Figure 4D:
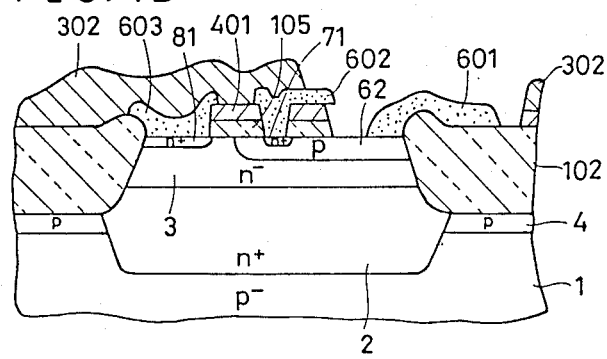

Then the substance is selectively etched to leave only the polysilicon film portions 602 and 603 serving as the sources of the aforementioned diffusion, thereby to define a base contact window employing a resist film 302 as a mask (FIG. 4D).

Figure 4E:
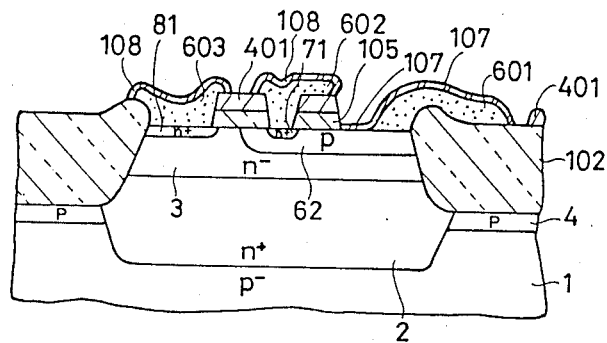

At this time, the portion for defining the base contact window and the oxide film 106 and the PSG film 401 on the polysilicon film 601 communicating with the said portion are removed by etching employing the polysilicon film 602 partially as a mask in such a manner that the resist film 302 is within the inner side of the polysilicon film 602 for forming the aforementioned emitter layer. The substance is oxidized at a low temperature of about 800° to 900° C. to form a thick oxide film 108 on the $n^+$-type polysilicon films 602 and 603 and a thin oxide film 107 on the p-type silicon substrate 62 and the $p^+$-type polysilicon layer 601 (FIG. 4E).

Figure 4F:
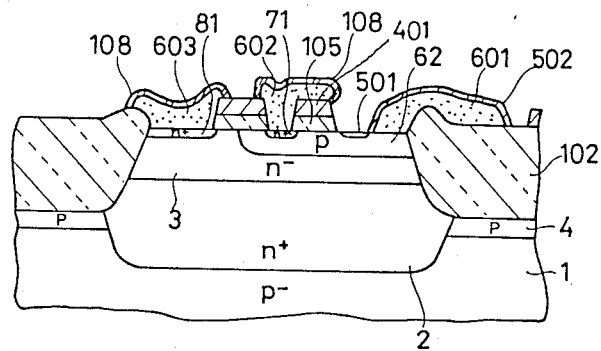

This step is performed based on the well-known fact that oxidation is enhanced by low temperature in silicon and polysilicon films including highly concentrated $n^+$-type impurities such as phosphor and arsenic. Then the oxide film 107 alone is washed out to form metal layers (not shown) for implementing metal silicide layers between the silicon and polysilicon layers of, e.g., platinum (Pt), palladium (Pd), titanium (Ti), tungsten (W) and molybdenum (Mo) over the entire surface by evaporation or sputtering. Thereafter the substance is sintered to form metal silicide films 501 and 502 on the exposed surface of the silicon substrate 62 and the surface of the polysilicon film 601, and the metal layers are removed by etching utilizing, e.g., nitrohydrochloric acid or aqua regia leaving the metal silicide films 501 and 502 (FIG. 4F).

Figure 4G:
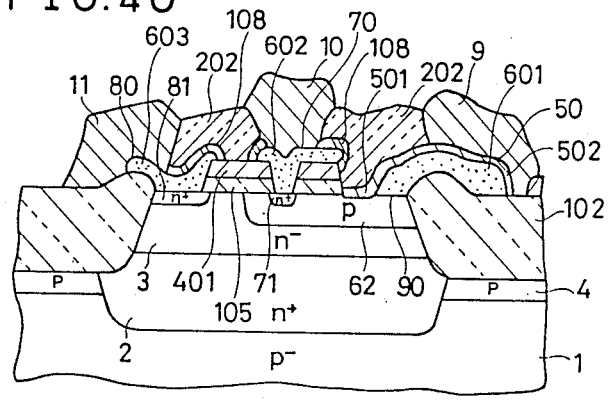

Then a passivation nitride film 202, which may be an oxide film, is coated on the substance and the nitride film 202 and the oxide film 108 are selectively etched to define a base electrode contact hole 50, an emitter electrode contact hole 70 and a collector electrode contact hole 80, followed by formation of a base electrode wire 9, an emitter electrode wire 10 and a collector electrode wire 11 respectively by a low-resistance metal such as aluminum (Al) (FIG. 4G).

Figure 5:
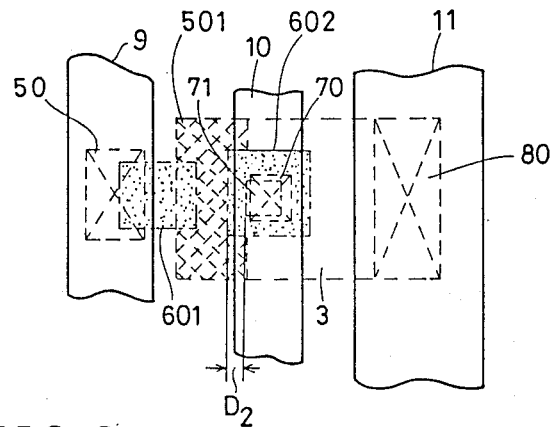
FIG. 5 is a plan view showing a pattern of a transistor manufactured by the embodiment of the present invention.
Figure 6:
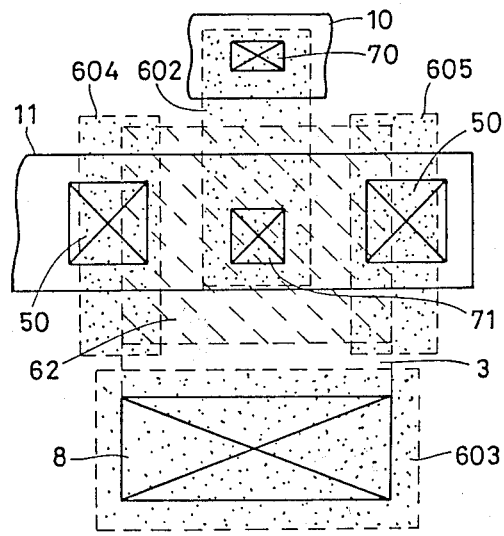
FIG. 6 is a plan view showing a pattern of a transistor in double-base structure manufactured by the embodiment of the present invention.

FIG. 5 is a plan view showing a pattern of a transistor manufactured by the aforementioned embodiment of the present invention and FIG. 6 is a plan view showing a pattern of a transistor in double-base structure manufactured by the subject embodiment while FIGS. 7A to 7C and 8 are cross-sectional views showing change in a distance $D_2$ between a polysilicon film and a metal silicide film depending on accuracy of superposition in photolithography.

Figure 1A:
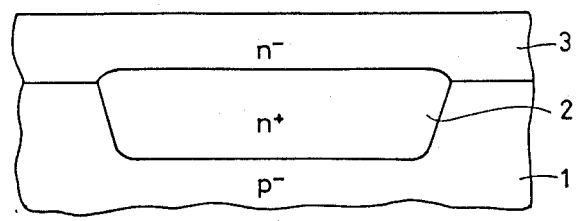
FIGS. 1A to 1E are cross-sectional views showing principal steps of a conventional method of manufacturing a semiconductor device.
Figure 1B:
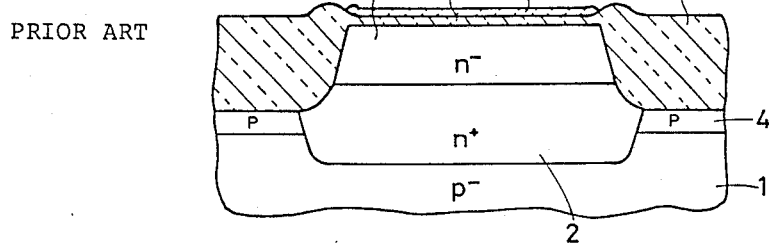
Figure 1C:
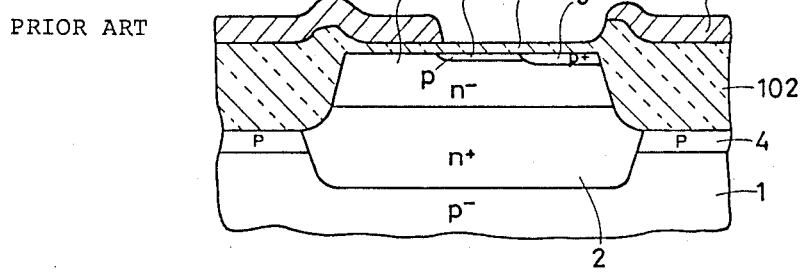
Figure 1D:
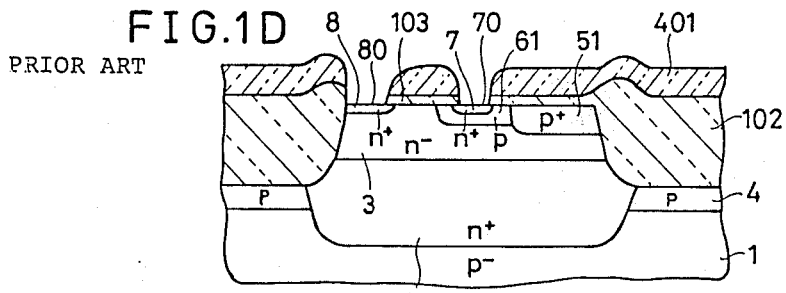
Figure 1E:
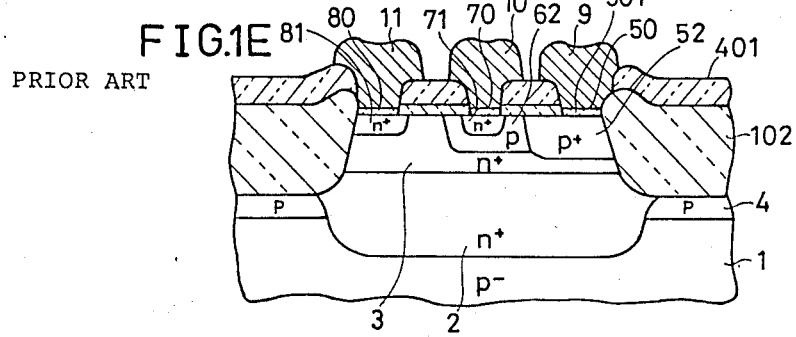
Figure 2:
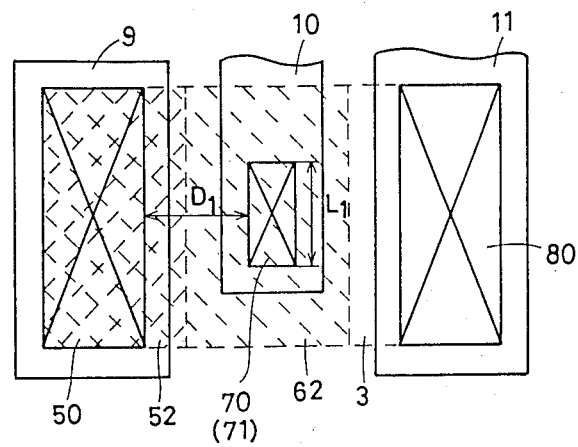
FIG. 2 is a plan view showing a pattern of a transistor in single-base structure manufactured by the conventional method as shown in FIGS. 1A to 1E.
Figure 3A:
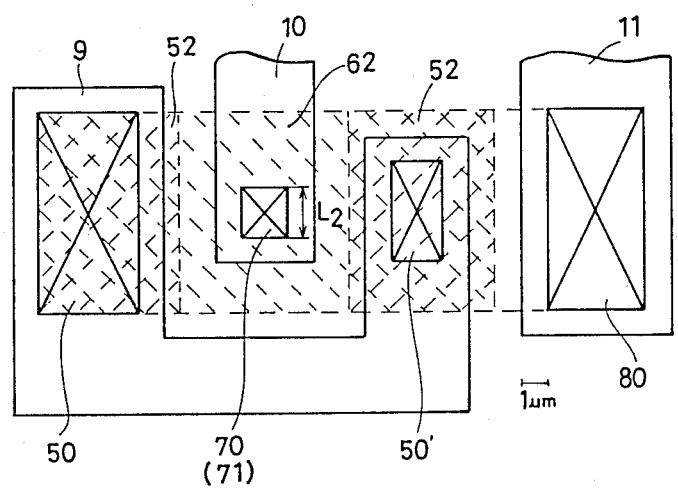
FIG. 3A is a plan view showing a pattern of a transistor in double-base structure manufactured by the conventional method as shown in FIGS. 1A to 1E.
Figure 3B:
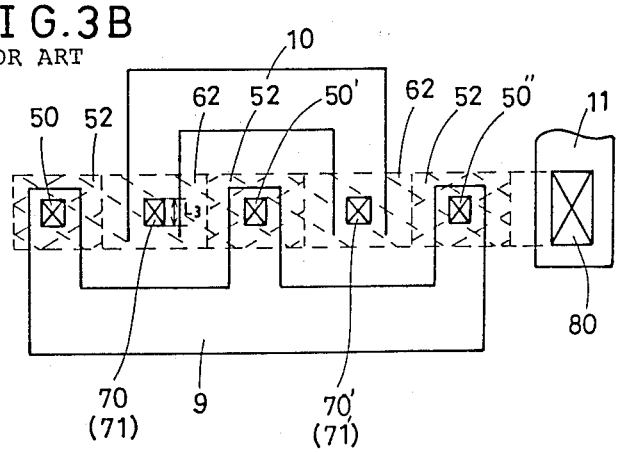
FIG. 3B is a plan view showing a pattern of a transistor in multi-emitter structure manufactured by the conventional method as shown in FIGS. 1A to 1E.

In a transistor manufactured by the method as shown in FIGS. 4A to 4G, the distance $D_2$ between an emitter layer 71 and a metal silicide film 501 is determined by a superposed portion of a diffusion window corresponding to the emitter layer 71 and the polysilicon film 602 which serves as the source of the diffusion. Therefore, the distance $D_2$ can be reduced in comparison with the distance $D_1$ in the conventional transistor as shown in FIG. 2. The base resistance is decreased by the reduction in the distance $D_2$ and further by employment of the metal silicide film 501 which is lower in resistivity of several $\Omega/\square$ to tens of $\Omega/\square$ than the conventional $p^+$-type external base layer 52 of tens of $\Omega/\square$ to 100 $\Omega/\square$. In addition to eliminating use of the $p^+$-type external base layer 52, the base layer 62 itself is slightly reduced in size whereby the base-to-collector capacity is decreased to improve the frequency characteristic of the transistor.

Figure 7A:
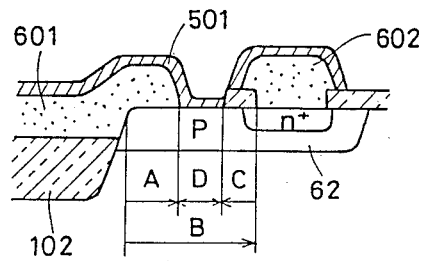
FIGS. 7A to 7C and 8 are cross-sectional views showing change in the distance between an emitter region and a metal silicide layer depending on accuracy of superposition in photolithography.

However, as shown in FIG. 7A, a polysilicon film 601 for implementing a base electrode is aligned with an isolation edge as indicated by an arrow A and an emitter contact is aligned with another isolation edge as indicated by an arrow B while a polysilicon film 602 for implementing an emitter is aligned with a contact as indicated by an arrow C, and hence the distance D between the polysilicon films 601 and 602, corresponding to the distance $D_2$ in FIG. 5, is determined by accuracy of superposition in photolithography.

Figure 7B:
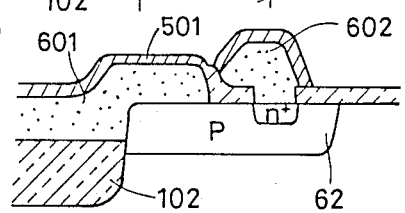
Figure 7C:
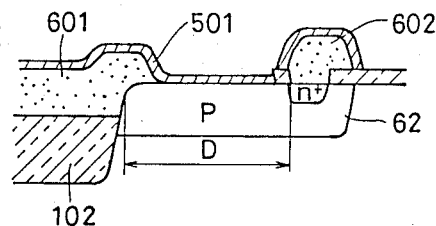

In the worst case, the distance D between the polysilicon films 601 and 602 is extremely changed as shown in FIGS. 7B and 7C from zero to three times as large as that in a normal state.

Figure 8:
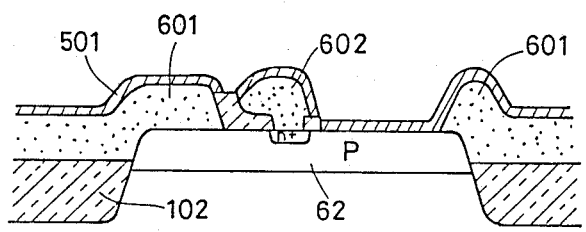

For overcoming such a disadvantage, the transistor is brought in the double-base structure as shown in FIG. 6, whereby the distance D₂ between the base electrode and the emitter diffusion portion remains as designed even if photolithography is performed in a worst case as shown in FIG. 8.

In the step as shown in FIG. 4B for removing the polysilicon film 601 by selective etching, polysilicon films 604 and 605 for implementing base electrodes are formed on both sides as shown in FIG. 6, thereby to bring the transistor in the double-base structure. The metal silicide films 502 are formed on the polysilicon films 604 and 605 respectively in a similar manner to the above. The transistor is thus brought in the double-base structure with the polysilicon films 604 and 605 for implementing base electrodes being formed on both sides over the isolation oxide film 102, whereby the base area is reduced. A collector electrode 603 is formed in a position opposite to the base and the emitter.

Figure 9:
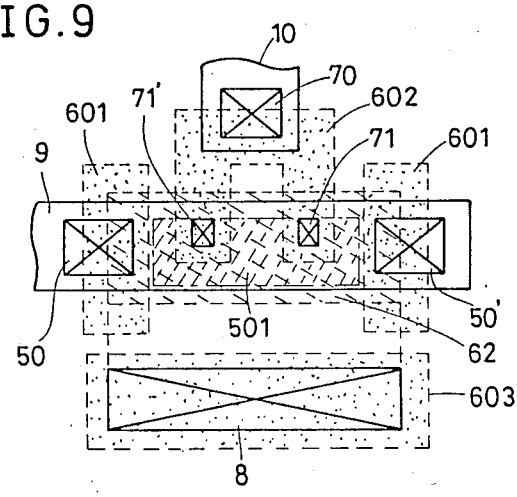
FIG. 9 is a plan view showing a pattern of a transistor in multi-emitter structure manufactured by the embodiment of the present invention.

FIG. 9 is a plan view showing a pattern of a transistor in multi-emitter structure manufactured according to the embodiment of the present invention. In the step as shown in FIG. 4C, at least two n⁺-type layers 71 and 71' for implementing emitter layers are formed for bringing the transistor in the multi-emitter structure. Then, in the step as shown in FIG. 4D, selective etching is so performed as to leave a polysilicon film 602 on the said at least two n⁺-type layers 71 and 71' for connecting the same with each other. Further, a metal silicide film 501 is formed to cover three sides each of the said at least two emitter layers 71 and 71' as shown in FIG. 9.

The transistor in the multi-emitter structure is thus formed in such a manner that three sides each of the emitter layers 71 and 71' are covered by the metal silicide film 51 to which a base electrode 9 is connected, and hence no specific base electrode is required between the emitter layers 71 and 71', whereby the base area is remarkably reduced.

Figure 10:
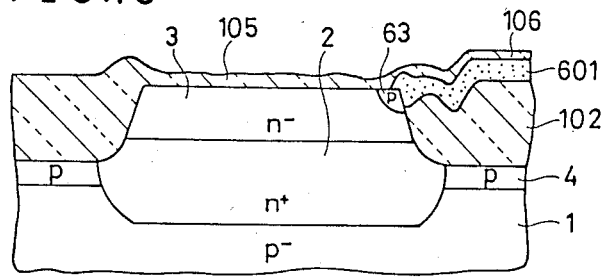
FIG. 10 is a cross-sectional view showing a principal step of a method of manufacturing a semiconductor device according to another embodiment of the present invention.

FIG. 10 is a cross-sectional view showing a principal step of a method of manufacturing a semiconductor device according to another embodiment of the present invention. The step as shown in FIG. 10 corresponds to that shown in FIG. 4B. When a polysilicon film 601 for partially implementing a base electrode is formed, an oxide film 102 corresponding to that in FIG. 4A is excessively etched to bring the polysilicon film 601 in contact with the side wall of a silicon island 3. The polysilicon film 601 is thus in contact with the side wall of the silicon island 3 to decrease a contact surface 90 as shown in FIG. 4G between the polysilicon film 601 and a base layer 62, whereby the base area can be reduced. The oxide film 102 is preferably etched to an extent that a diffusion layer 63 from the polysilicon film 601 is substantially identical in depth to the base layer 62 in view of pressure resistance. Further, the polysilicon film 601 may be formed in advance to formation of the base layer 62, thereby to control the depth of the base layer 62 and prevent a crystal defect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor layer (3) of a first conductivity type enclosed by an isolation oxide film (102);
   a base region (62) of a second conductivity type formed on a predetermined region of the major surface of said semiconductor layer;
   an insulating film (401) formed on a portion of said semiconductor layer surrounded by said isolation oxide film (102) and separated from the isolation oxide film and overlapping both said semiconductor layer (3) and said base region (62);
   an emitter region (71) of said first conductivity type formed on the major surface of said base region and a collector region (81) separated from said base region and formed on the major surface of said semiconductor layer between said insulating film and said isolation oxide film;
   said insulating film having a plurality of openings therein for contacting each of said base, emitter and collector regions,
   said emitter region formed under one of said openings in said insulating film;
   first silicon films (602, 603) formed in at least one of said openings of said insulating film and on a portion of another of said openings;
   a second silicon film (601) formed on said base region (62) between said insulating film (401) and said isolation oxide film (102), said second silicon film separated from said insulating film (401) and extending over said isolation oxide film (102) and said base region (62);
   a metal silicide film (501) formed on said second silicon film (601) and on said base region (62) between said second silicon film (601) and said insulating film (401);
   a base electrode (9) formed on said isolation oxide film (102) and in contact with said metal silicide film (501);
   an emitter electrode (10) formed on one of said first silicon films (602); and
   a collector electrode (11) electrically connected with said collector region.

2. A semiconductor device in accordance with claim 1, wherein
   said second silicon film (601) is so formed as to be in contact with a region of said metal silicide film (501) extending from a part of one of said openings in said insulating film (401) in contact with said base region and extending to a side wall of said first conductivity type semiconductor layer (3).

3. A semiconductor device in accordance with claim 1, wherein
   said insulating film (401) is provided with two openings contacting with said base region,
   said second silicon film (601) is formed on said two openings contacting with said base region, and
   said metal silicide film (501) is formed on said second silicon film (601) formed on said two openings.

4. A semiconductor device in accordance with claim 1, wherein
   at least two said second conductive emitter regions are formed on the major surface of said base region,
   said first silicon films are formed to connect said at least two emitter regions with each other, and
   said metal silicide film is formed on said base region to cover three sides of each of said at least two emitter regions.

5. A semiconductor device in accordance with claim 4, wherein
said metal silicide film is formed between said at least two emitter regions.

6. A semiconductor device in accordance with claim 1 wherein said isolation oxide film (102) is overetched so that said second silicon film (601) formed thereover is in contact with a sidewall of said semiconductor layer (3) of said first conductivity type thereby decreasing a contact surface between said second silicon film (601) and said base region (62).

7. A semiconductor device in accordance with claim 1 wherein said first silicon films (602, 603) are formed vertically displaced from and over said second silicon film (601) thereby providing for said metal silicide film (501) portion of a contact to said base region to be horizontally adjacent said first silicon film (602) portion of a contact to said emitter region, and to reduce a distance therebetween.

8. A semiconductor device in accordance with claim 7 wherein said first silicon films (602, 603) and said second silicon film (601) are separated by a vertical distance determined by a thickness of said insulating film (401).

9. A semiconductor device in accordance with claim 8 wherein said vertical distance separating said first silicon films (602, 603) and said second silicon film (601) is a sum of the thickness of said insulating film (401) and an oxide layer (105).

10. A semiconductor device in accordance with claim 1 wherein an area of contact between said base electrode (9) and said metal silicide film (501) is limited to a region substantially over said isolation oxide film (102).

* * * * *